(12) United States Patent
Liao et al.

(10) Patent No.: US 12,538,791 B2
(45) Date of Patent: Jan. 27, 2026

(54) SOURCE/DRAIN CONTACT FOR SEMICONDUCTOR DEVICE STRUCTURE

(71) Applicant: Taiwan Semiconductor Manufacturing Company, Ltd., Hsinchu (TW)

(72) Inventors: Chun-Hung Liao, Taichung (TW); Lin-Yu Huang, Hsinchu (TW); Chia-Hao Chang, Hsinchu (TW); Huang-Lin Chao, Hillsboro, OR (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 171 days.

(21) Appl. No.: 18/347,264

(22) Filed: Jul. 5, 2023

(65) Prior Publication Data

US 2023/0343638 A1   Oct. 26, 2023

Related U.S. Application Data

(62) Division of application No. 17/097,409, filed on Nov. 13, 2020, now Pat. No. 11,735,470.

(51) Int. Cl.
*H01L 23/528* (2006.01)
*H01L 21/768* (2006.01)
(Continued)

(52) U.S. Cl.
CPC .... *H01L 23/5283* (2013.01); *H01L 21/76832* (2013.01); *H01L 21/76834* (2013.01); *H01L 21/7684* (2013.01); *H01L 21/76883* (2013.01); *H01L 23/5226* (2013.01); *H10D 30/024* (2025.01); *H10D 30/6219* (2025.01); *H10D 64/01* (2025.01); *H10D 64/257* (2025.01); *H10D 84/0158* (2025.01); *H10D 84/038* (2025.01); *H10D 84/8312* (2025.01); *H01L 21/76844* (2013.01); *H10D 84/0149* (2025.01); *H10D 84/834* (2025.01)

(58) Field of Classification Search
CPC .......... H01L 23/5283; H01L 21/76832; H01L 21/76834; H01L 21/76877; H10D 30/6219; H10D 64/251; H10D 64/257; H10D 84/8312; H10D 84/834
See application file for complete search history.

(56) References Cited

U.S. PATENT DOCUMENTS 8,772,109 B2   7/2014   Colinge
8,785,285 B2   7/2014   Tsai et al.
(Continued)

*Primary Examiner* — Daniel Luke
(74) *Attorney, Agent, or Firm* — Birch, Stewart, Kolasch & Birch, LLP

(57) ABSTRACT

A semiconductor device structure includes a gate structure formed over a substrate. The semiconductor device structure also includes a source/drain structure formed beside the gate structure. The semiconductor device structure further includes a contact structure formed over the source/drain structure. The semiconductor device structure also includes a first cap layer formed over the contact structure. The semiconductor device structure further includes a dielectric structure extending from a top surface of the first cap layer into the contact structure. The dielectric structure and the source/drain structure are separated by the contact structure.

20 Claims, 15 Drawing Sheets

(51) Int. Cl.

*H01L 23/522* (2006.01)
*H10D 30/01* (2025.01)
*H10D 30/62* (2025.01)
*H10D 64/01* (2025.01)
*H10D 64/23* (2025.01)
*H10D 84/01* (2025.01)
*H10D 84/03* (2025.01)
*H10D 84/83* (2025.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,412,840 B1* | 8/2016 | Leobandung ........ H10D 62/822 |
| 9,520,482 B1 | 12/2016 | Chang et al. |
| 9,536,968 B2* | 1/2017 | Park ................. H10D 64/258 |
| 9,576,814 B2 | 2/2017 | Wu et al. |
| 10,199,271 B1* | 2/2019 | Xie .................. H01L 23/535 |
| 10,276,565 B2* | 4/2019 | Huang ................ H10D 84/83 |
| 10,283,406 B2 | 5/2019 | Basker et al. |
| 10,505,022 B2 | 12/2019 | Chiang et al. |
| 11,239,115 B2 | 2/2022 | Xie et al. |
| 11,251,306 B2 | 2/2022 | Bae et al. |
| 2019/0304902 A1* | 10/2019 | Subramanian ....... H10D 84/038 |

* cited by examiner

SOURCE/DRAIN CONTACT FOR SEMICONDUCTOR DEVICE STRUCTURE

PRIORITY CLAIM AND CROSS-REFERENCE

This application is a Divisional application of U.S. patent application Ser. No. 17/097,409, filed on Nov. 13, 2020, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or ILD structures, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-1, 2A-2, 2B-1, 2B-2, 2C-1, 2C-2, 2D-1, 2D-2, 2E-1, 2E-2, 2F-1, 2F-2, 2G-1, 2G-2 are cross-sectional representations of various stages of forming a semiconductor device structure, in accordance with some embodiments of the disclosure.

DETAILED DESCRIPTION

Figure 1:
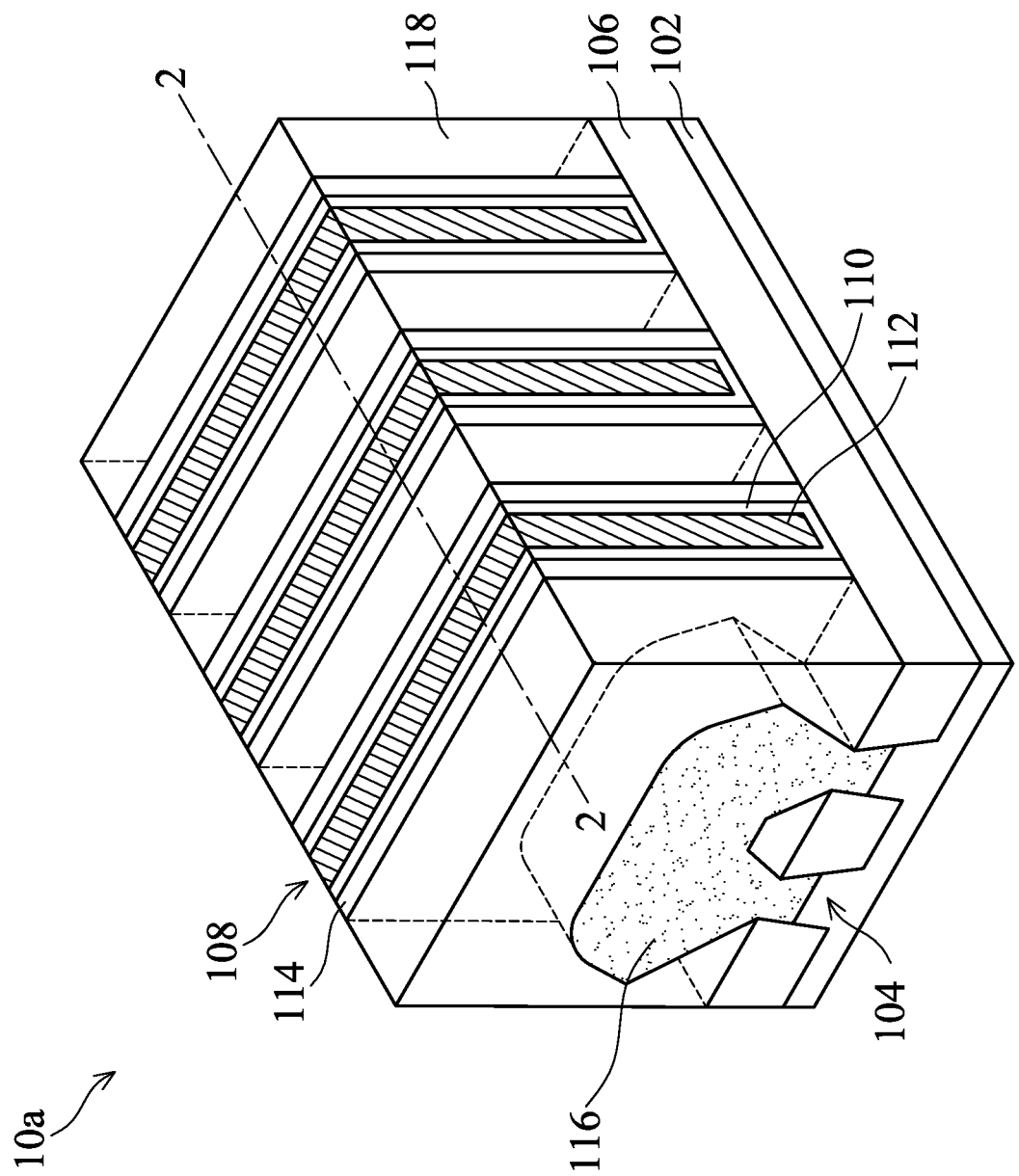
FIG. 1 is a perspective representation of a semiconductor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Fin structures described below may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Herein, the terms "around," "about," "substantial" usually mean within 20% of a given value or range, and better within 10%, 5%, or 3%, or 2%, or 1%, or 0.5%. It should be noted that the quantity herein is a substantial quantity, which means that the meaning of "around," "about," "substantial" are still implied even without specific mention of the terms "around," "about," "substantial."

Embodiments for forming a semiconductor structure are provided. The method for forming the semiconductor structure may include forming a dielectric structure surrounded by the contact structure. With less metal in the contact structure, selection of the metal of the contact structure and the chemical used in the following planarization process may be more flexible and the metal peeling issue may be avoided. In addition, the process time may be reduced and money may be saved.

FIG. 1 is a perspective representation of a semiconductor structure 10a, in accordance with some embodiments of the disclosure. FIGS. 2A-1, 2A-2, 2B-1, 2B-2, 2C-1, 2C-2, 2D-1, 2D-2, 2E-1, 2E-2, 2F-1, 2F-2, 2G-1, 2G-2 are cross-sectional representations of various stages of forming a semiconductor structure 10a, in accordance with some embodiments of the disclosure. FIGS. 2A-1, 2A-2, 2B-1, 2B-2, 2C-1, 2C-2, 2D-1, 2D-2, 2E-1, 2E-2, 2F-1, 2F-2, 2G-1, 2G-2 show cross-sectional representations taken along line 2-2 in FIG. 1.

Figures 1, 2A:
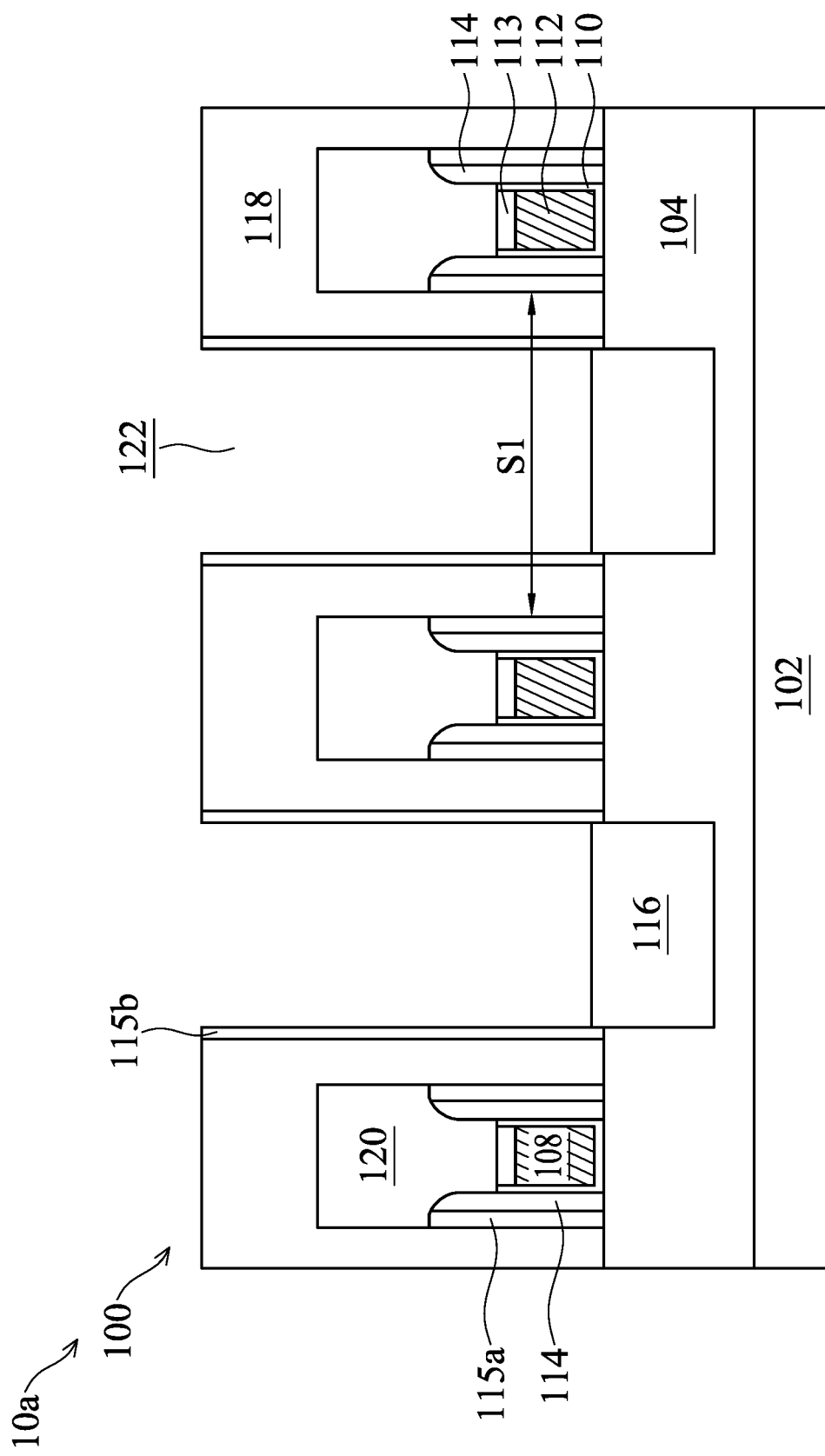
Figures 2, 2A:
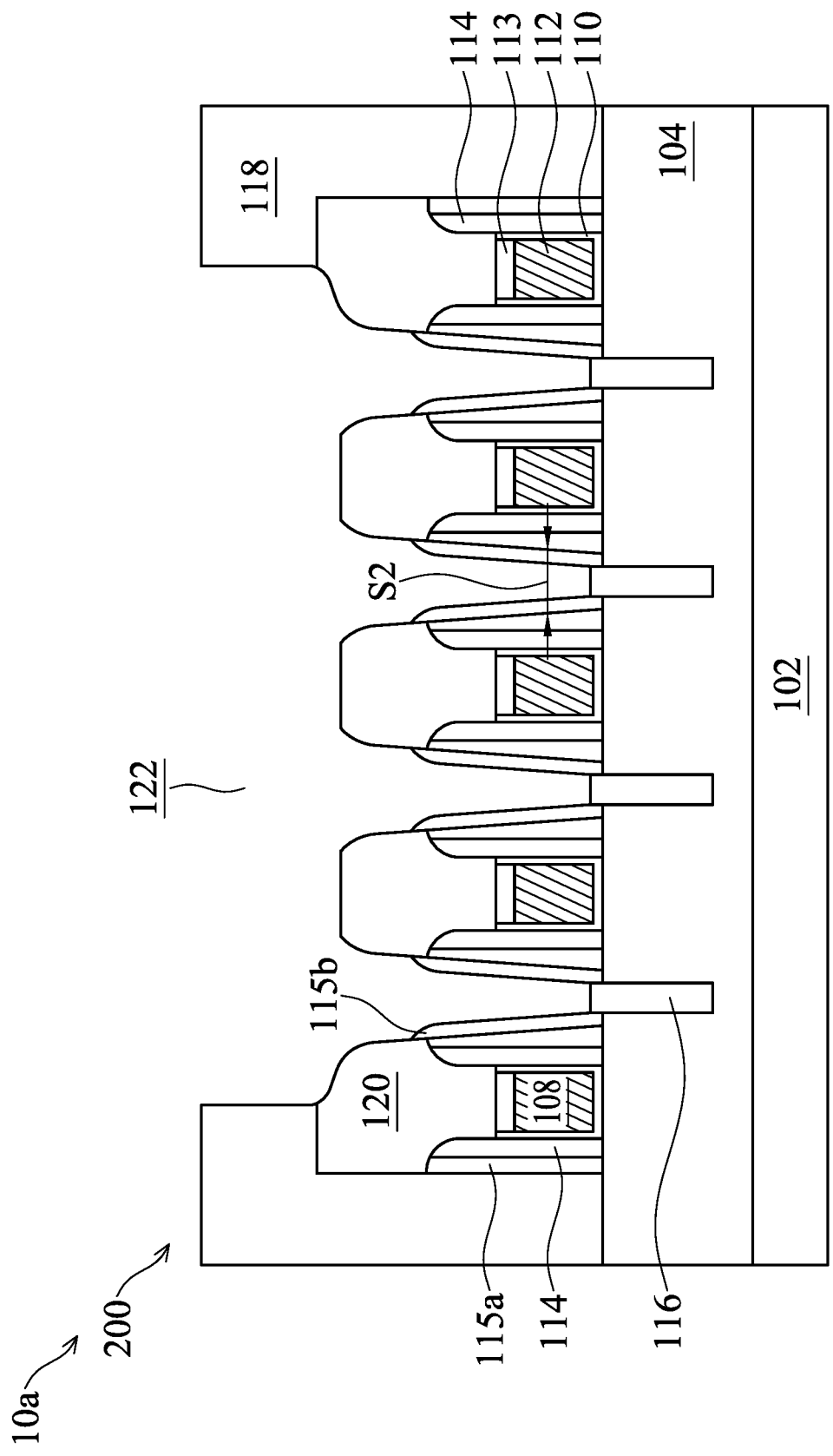

A substrate 102 is provided as shown in FIGS. 1, 2A-1, and 2A-2 in accordance with some embodiments. In some embodiments, as shown in FIGS. 2A-1 and 2A-2, the substrate 102 includes a first region 100 and a second region 200. In the following, figures having the suffix "-1" (e.g., FIG. 2A-1) are perspective representations or cross-sectional representations of some embodiments of the semiconductor structure 10a formed in the first region 100. In addition, figures having the suffix "-2" (e.g., FIG. 2A-2) are perspective representations or cross-sectional representations of some embodiments of the semiconductor structure 10a formed in the second region 200. The device density in the first region 100 and the second region 200 are different, which will be described in detail later.

The substrate 102 may be a semiconductor wafer such as a silicon wafer. The substrate 102 may also include other elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium nitride, gallium arsenic, gallium phosphide, indium phosphide, indium arsenide, and/or indium antimonide.

Examples of the alloy semiconductor materials may include, but are not limited to, SiGe, GaAsP, AlInAs, AlGaAs, GaInAs, GaInP, and/or GaInAsP. The substrate 102 may include an epitaxial layer. For example, the substrate 102 may have an epitaxial layer overlying a bulk semiconductor. In addition, the substrate 102 may also be semiconductor on insulator (SOI). The SOI substrate may be fabricated by a wafer bonding process, a silicon film transfer process, a separation by implantation of oxygen (SIMOX) process, other applicable methods, or a combination thereof. The substrate 102 may be an N-type substrate. The substrate 102 may be a P-type substrate.

Next, a pad layer may be blanketly formed over the substrate 102, and a hard mask layer may be blanketly formed over the pad layer (not shown). The pad layer may be a buffer layer between the substrate 102 and the hard mask layer. In addition, the pad layer may be used as a stop layer when the hard mask layer is removed. The pad layer may be made of silicon oxide. The hard mask layer may be made of silicon oxide, silicon nitride, silicon oxynitride, or another applicable material. The pad layer and the hard mask layer may be formed by deposition processes, such as a chemical vapor deposition (CVD) process, a high-density plasma chemical vapor deposition (HDPCVD) process, a spin-on process, a sputtering process, other applicable processes, or a combination thereof.

Afterwards, a photoresist layer may be formed over the hard mask layer (not shown). The photoresist layer may be patterned by a patterning process. The patterning process may include a photolithography process and an etching process. Examples of photolithography processes include photoresist coating (e.g., spin-on coating), soft baking, mask aligning, exposure, post-exposure baking, developing the photoresist, rinsing and drying (e.g., hard baking). The etching process may be a dry etching process or a wet etching process. As a result, a patterned pad layer and a patterned hard mask layer may be obtained. Afterwards, the patterned photoresist layer may be removed.

Afterwards, an etching process is performed on the substrate 102 to form a fin structure 104 by using the hard mask layer as a mask as shown in FIGS. 1, 2A-1, and 2A-2 in accordance with some embodiments. The etching process may be a dry etching process or a wet etching process. The substrate 102 may be etched by a dry etching process. The dry etching process may include using a fluorine-based etchant gas, such as $SF_6$, $C_xF_y$ (where x and y may be positive integers), $NF_3$, or a combination thereof. The etching process may be a time-controlled process, and continue until the fin structure 104 reaches a predetermined height.

Next, a liner layer may be conformally formed on the sidewalls and the top surface of the fin structure 104 (not shown). The liner layer may be used to protect the fin structure 104 from being damaged in the following processes (such as an anneal process or an etching process). In some embodiments, the liner layer is made of silicon nitride.

Next, an isolation layer 106 is formed to cover the fin structure 104 and the substrate 102 as shown in FIG. 1 in accordance with some embodiments, The isolation layer 106 may be made of silicon oxide, silicon nitride, silicon oxynitride, fluoride-doped silicate glass (FSG), or another low-k dielectric material. The isolation layer 106 may be deposited by a deposition process, such as a chemical vapor deposition (CVD) process such as low pressure CVD (LPCVD), plasma enhanced CVD (PECVD), or high density plasma CVD (HDP-CVD), high aspect ratio process (HARP), flowable CVD (FCVD), atomic layer deposition (ALD), a spin-on-glass process, other applicable processes, or a combination thereof.

Afterwards, the isolation layer 106 may be planarized to expose the top surface of the patterned hard mask layer (not shown). The isolation layer 106 may be planarized by a chemical mechanical polishing (CMP) process. Afterwards, the patterned hard mask layer may be removed. The patterned hard mask layer may be removed by a wet etching process. The wet etching process may include using a phosphoric acid ($H_3PO_4$) etching solution.

Next, an etching process is performed on the isolation layer 106, as shown in FIG. 1 in accordance with some embodiments. The etching process may be used to remove a portion of the liner layer and a portion of the isolation layer 106. As a result, the top portion of the fin structure 104 may be exposed and the remaining isolation layer 106 may surround the base portion of the fin structure 104. The remaining isolation layer 106 may be an isolation structure 106 such as a shallow trench isolation (STI) structure surrounding the base portion of the fin structure 104. The isolation structure 106 may be configured to prevent electrical interference or crosstalk.

Next, a gate structure 108 is formed over and across the fin structures 104, as shown in FIGS. 1, 2A-1, and 2A-2 in accordance with some embodiments. In some embodiments, the gate structure 108 includes an interfacial layer (not shown), a gate dielectric layer 110 and a gate electrode layer 112. In some embodiments, the gate dielectric layer 110 is a dummy gate dielectric layer and the gate electrode layer 112 is a dummy gate electrode layer. The dummy gate dielectric layer and the dummy gate electrode layer may be replaced by the following steps to form a real gate structure with a high-k dielectric layer and a metal gate electrode layer.

As shown in FIGS. 2A-1 and 2A-2, the spacing between adjacent gate structures 108 in region 100 and region 200 are different. For example, the spacing S1 between adjacent gate structures 108 in region 100 is greater than the spacing S2 between adjacent gate structures 108 in region 200. In some embodiments, the semiconductor structure 10a in region 200 is more dense than the semiconductor structure 10a in region 100.

The interfacial layer may include silicon oxide. The silicon oxide may be formed by an oxidation process (such as a dry oxidation process, or a wet oxidation process), deposition process (such as a chemical vapor deposition (CVD) process or an atomic layer deposition (ALD) process), other applicable processes, or a combination thereof. The interfacial layer may be thermally grown using a thermal oxidation process in oxygen-containing ambient or nitrogen-containing ambient (e.g., NO or $N_2O$).

The gate dielectric layer 110 may include silicon oxide. The silicon oxide may be formed by an oxidation process (e.g., a dry oxidation process, or a wet oxidation process), a chemical vapor deposition process, other applicable processes, or a combination thereof. Alternatively, the gate dielectric layer 110 may include a high-k dielectric layer (e.g., the dielectric constant is greater than 3.9) such as hafnium oxide (HfO$_2$). Alternatively, the high-k dielectric layer may include other high-k dielectrics, such as LaO, AlO, ZrO, TiO, Ta$_2$O$_5$, Y$_2$O$_3$, SrTiO$_3$, BaTiO$_3$, BaZrO, HfZrO, HfLaO, HfTaO, HfSiO, HfSiON, HfTiO, LaSiO, AlSiO, (Ba, Sr) TiO$_3$, Al$_2$O$_3$, other applicable high-k dielectric materials, or a combination thereof. The high-k dielectric layer may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

The gate electrode layer 112 may include polycrystalline-silicon (poly-Si), poly-crystalline silicon-germanium (poly-SiGe), metals (e.g., tungsten, titanium, aluminum, copper, molybdenum, nickel, platinum, the like, or a combination thereof), metal alloys, metal-nitrides (e.g., tungsten nitride, molybdenum nitride, titanium nitride, tantalum nitride, the like, or a combination thereof), metal-silicides (e.g., tungsten silicide, titanium silicide, cobalt silicide, nickel silicide, platinum silicide, erbium silicide, the like, or a combination thereof), metal-oxides (e.g., ruthenium oxide, indium tin oxide, the like, or a combination thereof), other applicable materials, or a combination thereof. The gate electrode layer 112 may be formed by a chemical vapor deposition process (e.g., a low pressure chemical vapor deposition process, or a plasma enhanced chemical vapor deposition process), a physical vapor deposition process (e.g., a vacuum evaporation process, or a sputtering process), other applicable processes, or a combination thereof.

Afterwards, an etching process may be performed on the gate dielectric layer 110 and the gate electrode layer 112 to form the gate structure 108 by using a patterned photoresist layer as a mask (not shown). The etching process may be a dry etching process or a wet etching process. In some embodiments, the gate dielectric layer 110 and the gate electrode layer 112 are etched by a dry etching process. The dry etching process may include using a fluorine-based etchant gas, such as SF$_6$, C$_x$F$_y$ (where x and y may be positive integers), NF$_3$, or a combination thereof. After the etching process, the top portion of the fin structure 104 may be exposed on the opposite sides of the gate structure 108.

Moreover, the top portion of the gate electrode layer 112 is removed, and a recess is formed over the gate electrode layer 112 (not shown). A gate hard mask layer 113 is formed over the gate electrode layer 112, as shown in FIGS. 2A-1 and 2A-2 in accordance with some embodiments. The gate hard mask layer 113 may be made of low-k dielectric materials such as silicon oxide, silicon nitride, silicon oxynitride, other low-k dielectric materials, or a combination thereof.

Next, a pair of spacers 114 are formed over opposite sidewalls of the gate structure 108, as shown in FIGS. 1, 2A-1, and 2A-2 in accordance with some embodiments. The spacers 114 may be made of silicon oxide, silicon nitride, silicon oxynitride, and/or other dielectric materials. The spacers 114 may be formed by a chemical vapor deposition (CVD) process, a spin-on-glass process, other applicable processes, or a combination thereof.

Next, a first liner layer 115a is formed over the sidewalls of the spacers 114, as shown in FIGS. 2A-1 and 2A-2 in accordance with some embodiments. The first liner 115a may be made of SiC, LaO, AlO, AlON, ZrO, HfO, SiN, ZnO, ZrN, ZrAlO, TiO, TaO, YO, TaCN, ZrSi, SiOCN, SiOC, SiCN, LaO, SiO, other materials, or a combination thereof. The first liner layer 115a may be formed by a chemical vapor deposition process (e.g., a plasma enhanced chemical vapor deposition (PECVD) process, or a metalorganic chemical vapor deposition (MOCVD) process), an atomic layer deposition (ALD) process (e.g., a plasma enhanced atomic layer deposition (PEALD) process), a physical vapor deposition (PVD) process (e.g., a vacuum evaporation process, or a sputtering process), other applicable processes, or a combination thereof.

Afterwards, the top portion of the fin structure 104 exposed on the opposite sides of the gate structure 108 may be removed by an etching process to form a recess (not shown). The etching process may be a dry etching process or a wet etching process. The fin structures 104 may be etched by a dry etching process. The dry etching process may include using a fluorine-based etchant gas, such as SF$_6$, C$_x$F$_y$ (where x and y may be positive integers), NF$_3$, or a combination thereof.

Next, a source/drain structure 116 is formed in the recess over the fin structure 104 on opposite sides of the gate structure 108, as shown in FIGS. 1, 2A-1, and 2A-2 in accordance with some embodiments. A strained material may be grown in the recess by an epitaxial (epi) process to form the source/drain structure 116. In addition, the lattice constant of the strained material may be different from the lattice constant of the substrate 102. The source/drain structure 116 may include Ge, SiGe, InAs, InGaAs, InSb, GaAs, GaSb, InAlP, InP, SiC, SiP, other applicable materials, or a combination thereof. The source/drain structure 116 may be formed by an epitaxial growth step, such as metalorganic chemical vapor deposition (MOCVD), metalorganic vapor phase epitaxy (MOVPE), plasma-enhanced chemical vapor deposition (PECVD), remote plasma-enhanced chemical vapor deposition (RP-CVD), molecular beam epitaxy (MBE), hydride vapor phase epitaxy (HVPE), liquid phase epitaxy (LPE), chloride vapor phase epitaxy (Cl-VPE), other suitable methods, or a combination thereof.

After the source/drain structure 116 is formed, a first inter-layer dielectric (ILD) structure 118 is formed to cover the source/drain structure 116 as shown in FIG. 1 in accordance with some embodiments. In some embodiments, the ILD structure 118 surrounds the fin structures 104 and the source/drain structure 116.

The ILD structure 118 may include multilayers made of multiple dielectric materials, such as silicon oxide, silicon nitride, silicon oxynitride, phosphosilicate glass (PSG), borophosphosilicate glass (BPSG), low-k dielectric material, other applicable dielectric materials, or a combination thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 118 may be formed by chemical vapor deposition (CVD), spin-on coating, other applicable processes, or a combination thereof.

Afterwards, a planarizing process is performed on the ILD structure 118 until the top surface of the gate structure 108 is exposed, as shown in FIG. 1 in accordance with some embodiments. After the planarizing process, the top surface of the gate structure 108 may be substantially level with the top surfaces of the spacers 114 and the ILD structure 118. The planarizing process may include a grinding process, a chemical mechanical polishing (CMP) process, an etching process, other applicable processes, or a combination thereof.

Next, the gate structure 108 and the spacers 114 are recessed to form a trench (not shown). The recessing process may include one or more etching processes, such as dry etching and/or wet etching. In some embodiments as shown in FIGS. 2A-1 and 2A-2, the top portions of the spacers 114 and the first liner layer 115a have a rounding profile after the recessing process is performed.

Next, a first cap layer 120 is formed in the trench above the gate structure 108, the spacers 114, and the first liner layer 115a, as shown in FIGS. 2A-1 and 2A-2 in accordance with some embodiments. The first cap layer 120 may provide isolation for subsequently formed contact structure and conductive elements nearby. The first cap layer 120 may be made of dielectric materials such as LaO, AlO, Si, YO, TaCN, ZrSi, SiOCN, SiOC, SiCN, LaO, ZrN, ZrAlO, TiO, TaO, ZrO, HfO, SiN, HfSi, AlON, SiO, SiC, ZnO, other applicable materials, or a combination thereof. The first cap layer 120 may be deposited in the trench by CVD (such as HDP-CVD, PECVD, or HARP), ALD, another suitable method, and/or a combination thereof. After the first cap layer 120 is deposited, a planarization process (e.g., a chemical mechanical polishing process or an etching back process) may be optionally performed to remove excess dielectric materials.

Next, the ILD structure 118 over the source/drain structure 116 may be removed, and an opening 122 may be formed over the source/drain structure 116. The opening 122 may be formed by an etching process such as a dry etching process or a wet etching process.

As shown in FIGS. 2A-1 and 2A-2, since the spacing S1 between adjacent gate structures 108 in region 100 is greater than the spacing S2 between adjacent gate structures 108 in region 200, the width of the opening 122 in the region 100 is greater than the width of the opening 122 in the region 200. In some embodiments, the width W1 of the opening 122 in the region 100 is greater than 40 nm, and the width W2 of the opening 122 in the region 200 is less than 40 nm. In some embodiments, since the spacing S1 between adjacent gate structures 108 in region 100 is greater than the spacing S2 between adjacent gate structures 108 in region 200, the ILD structure 118 may remain between the gate structure 108 and the contact structure subsequently formed in the opening 122 in the first region 100.

Next, a second liner layer 115b is optionally formed over the sidewalls of the opening 122, as shown in FIGS. 2A-1 and 2A-2 in accordance with some embodiments. The second liner layer 115b may be conformally formed over the sidewalls and the bottom surface of the opening 122 first. Afterwards, an etching process may be performed and the second liner layer 115b is only left over the sidewalls of the opening 122. The second liner layer 115b may provide isolation between the gate structure 108 and the subsequently formed contact structure in the opening 122.

In some embodiments, since the spacing S1 between adjacent gate structures 108 in region 100 is greater than the spacing S2 between adjacent gate structures 108 in region 200, the first liner layer 115a formed over the sidewall of the gate structure 108 and the second liner layer 115b formed over the sidewall of the ILD structure 115b are separated by the ILD structure 118 in the first region 100. In some embodiments, the first liner layer 115a formed over the sidewall of the gate structure 108 and the second liner layer 115b formed over the sidewall of the ILD structure 118 are merged in the second region 200.

The second liner layer 115b may include SiC, LaO, AlO, AlON, ZrO, HfO, SiN, ZnO, ZrN, ZrAlO, TiO, TaO, YO, TaCN, ZrSi, SiOCN, SiOC, SiCN, LaO, SiO. In some embodiments, the first liner layer 115a and the second liner layer 115b are made of the same material. In some embodiments, the thickness of the second liner layer 115b is in a range from about 0.5 nm to about 5 nm. If the second liner layer 115b is too thick, it may be difficult to form a subsequently formed contact structure. If the second liner layer 115b is too thin, the isolation between the gate structure 108 and the subsequently formed contact structure may not be enough. The size of the subsequently formed contact structure may be controlled by the thickness of the second liner layer 115b.

Figures 1, 2B:
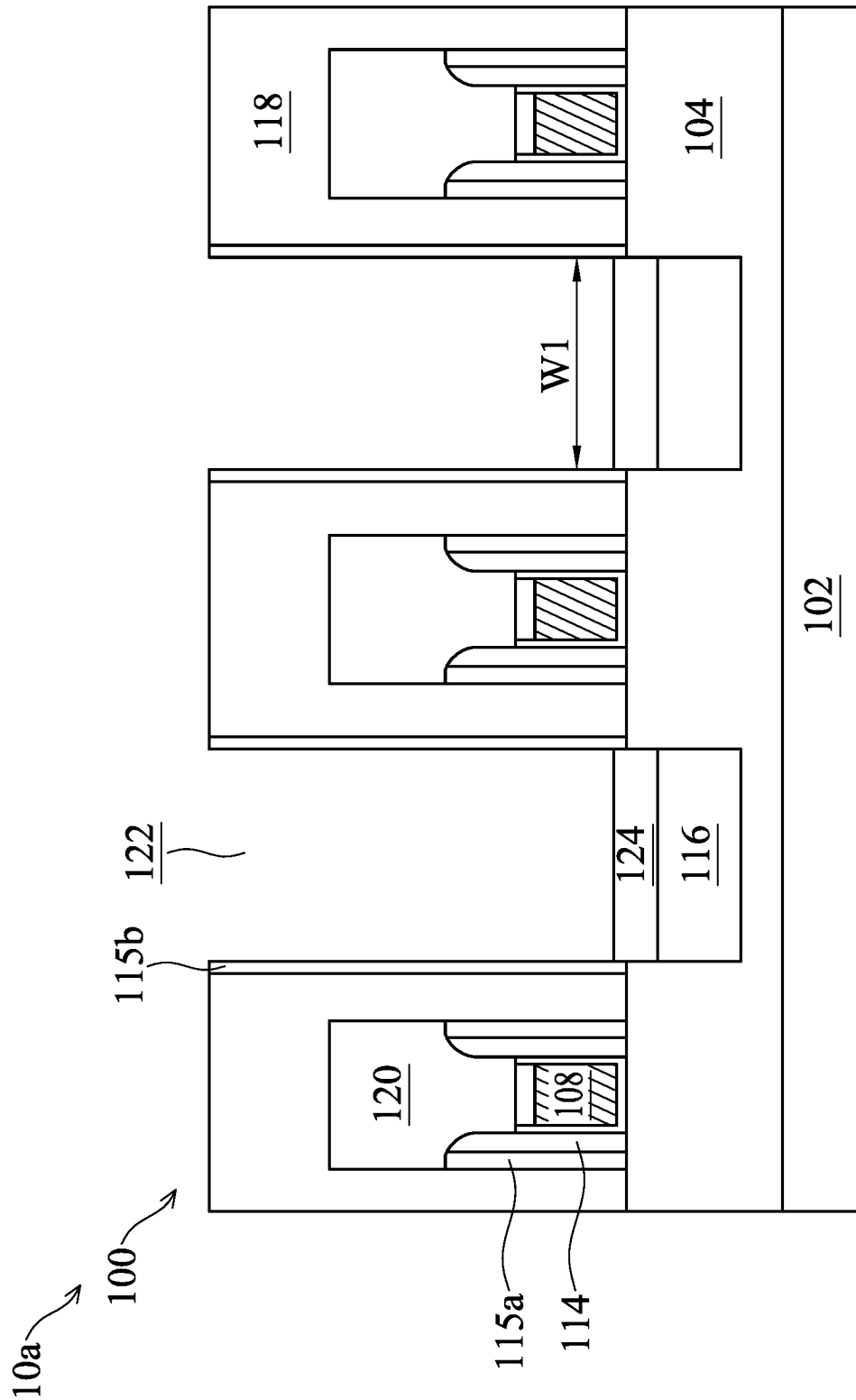
Figures 2, 2B:
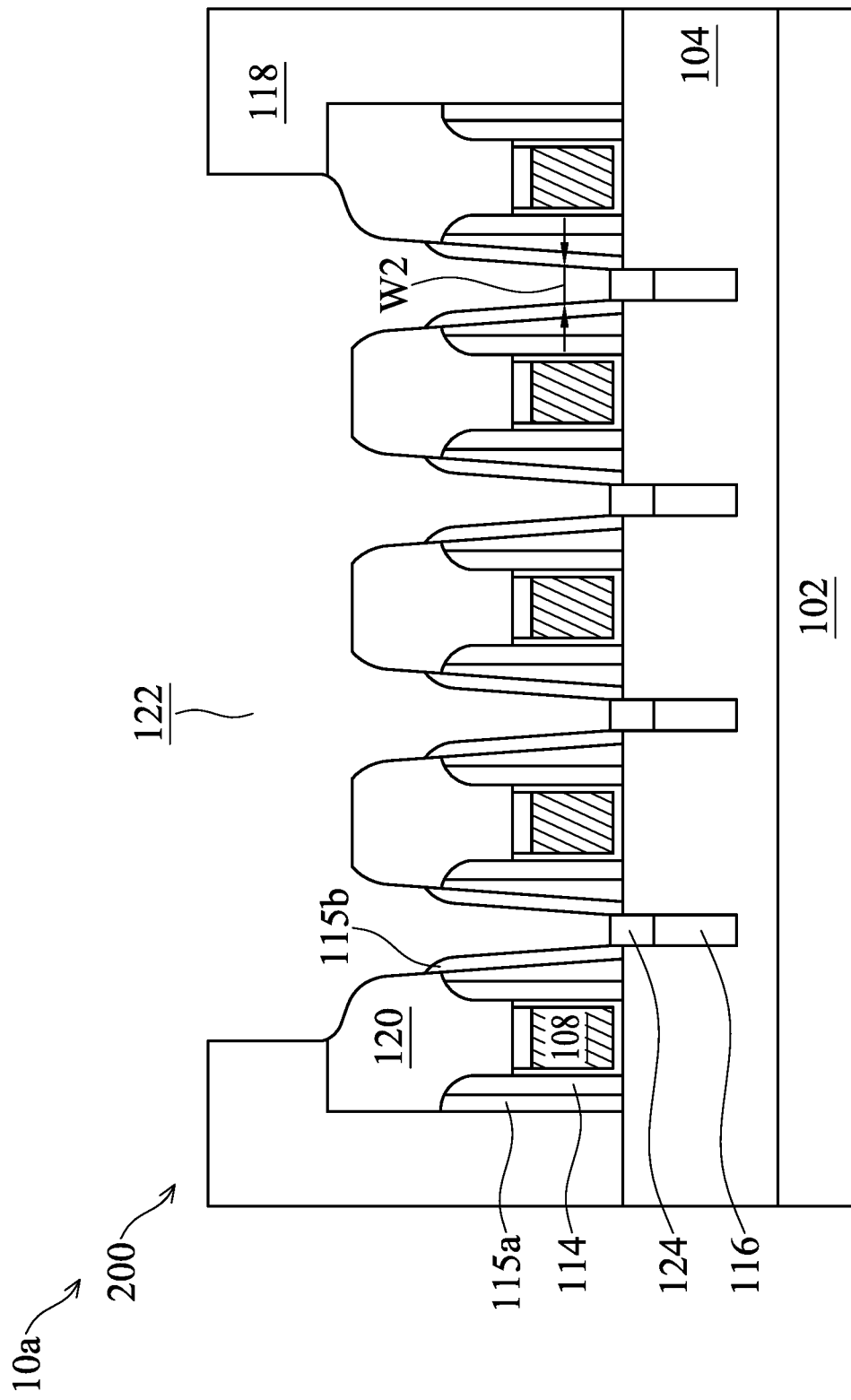

Next, a metal semiconductor compound layer 124 may be formed over the source/drain structure 116, as shown in FIGS. 2B-1 and 2B-2 in accordance with some embodiments. The metal semiconductor compound layer 124 may reduce the contact resistance between the source/drain structure 116 and the subsequently formed contact structure over the source/drain structure 116. The metal semiconductor compound layer 124 may be made of TiSi, CoSi, NiSi, RuSi, MoSi, WSi, other suitable low-resistance materials, or a combination thereof. The metal semiconductor compound layer 124 may be formed over the source/drain structure 116 by forming a metal layer over the source/drain structure 116 first. The metal layer may react with the source/drain structure 116 by an annealing process and the semiconductor compound layer may be produced. Afterwards, the unreacted metal layer may be removed by an etching process and the metal semiconductor compound layer 124 may be left.

Figures 1, 2C:
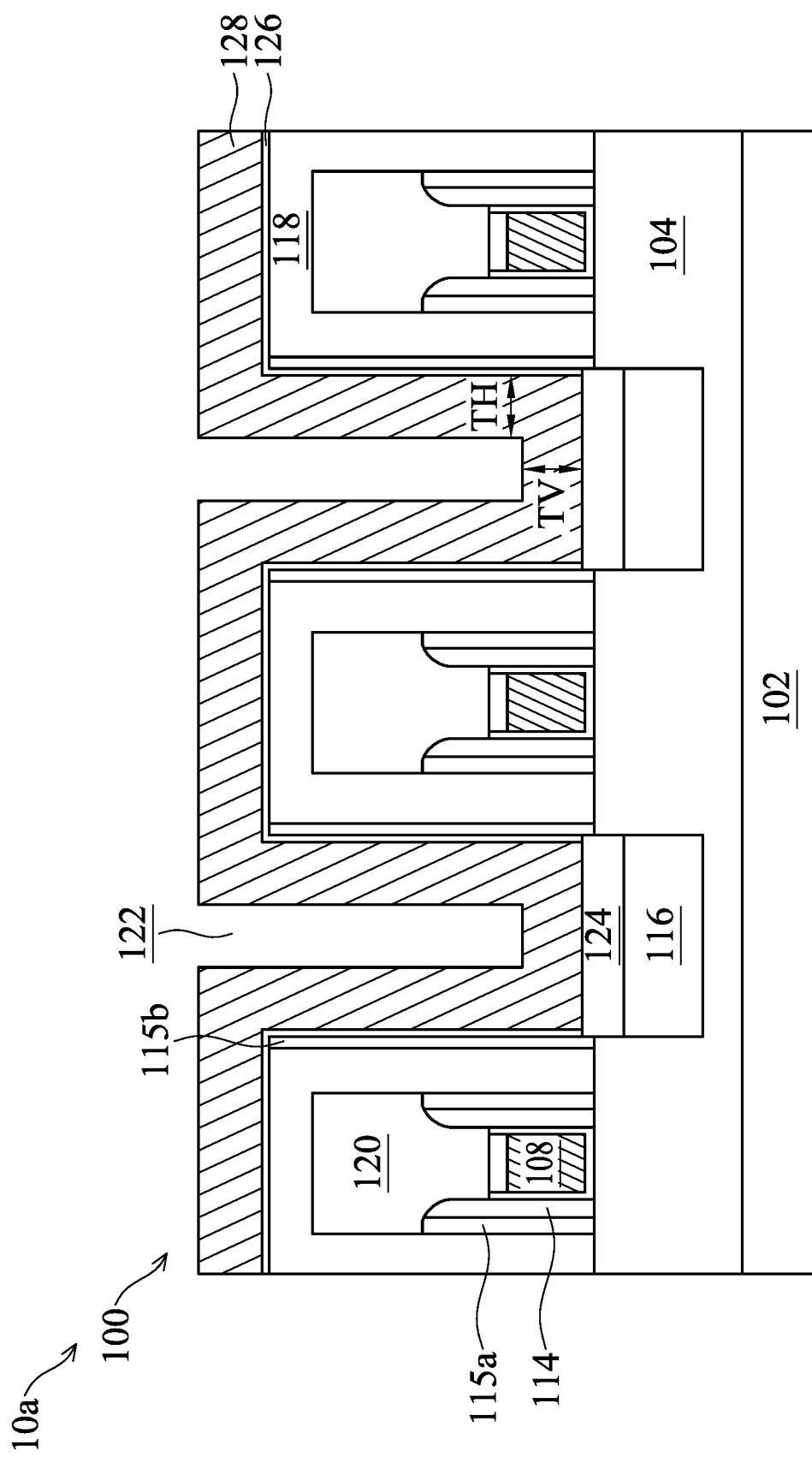
Figures 2, 2C:
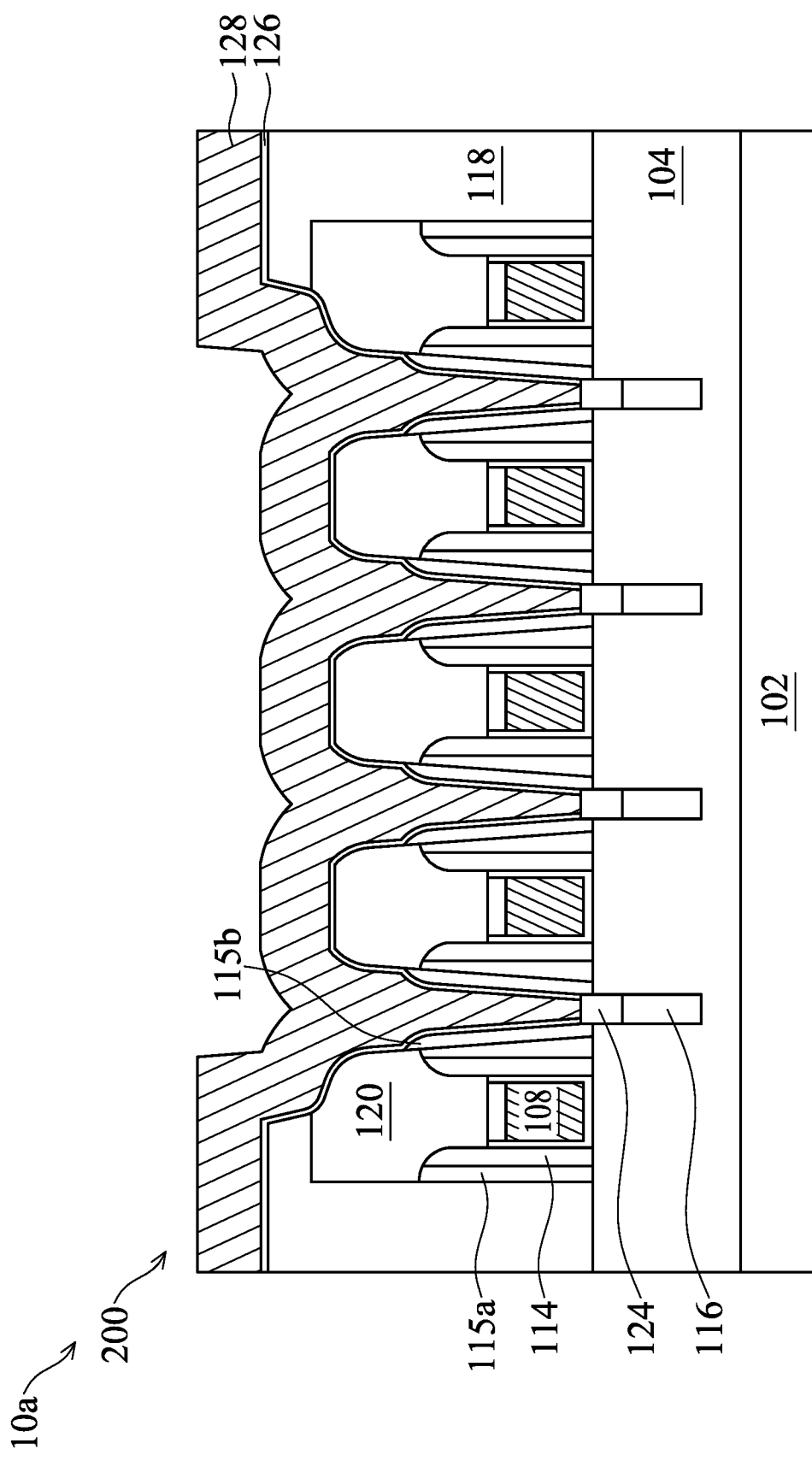

Next, a glue layer 126 is optionally formed over the sidewalls of the opening 122 and the top surface of the ILD structure 118. The glue layer 126 may be conformally formed over the bottom surface and the sidewalls of the opening 122 first. Afterwards, the glue layer 126 is etched back over the source/drain region 116, as shown in FIGS. 2C-1 and 2C-2 in accordance with some embodiments. The glue layer 126 may be formed before filling the conductive material in the opening 122 to prevent the conductive material from diffusing out. The glue layer 126 may serve as an adhesive layer to provide adhesion between the second liner layer 115b and the conductive material of subsequently formed contact structure. The material of the glue layer 126 may be TiN, TaN, TiSiN, TiSi, other applicable materials, or a combination thereof. The glue layer 126 may be formed by a physical vapor deposition process (PVD) (e.g., evaporation or sputtering), an atomic layer deposition process (ALD), an electroplating process, other applicable processes, or a combination thereof. In some embodiments, the thickness of the glue layer 126 is in a range from about 0.5 nm to about 4 nm. If the glue layer 126 is too thick, the resistance may be increased.

Next, a conductive layer 128 is conformally formed over the sidewalls and the bottom surface of the opening 122 and the top surface of the ILD structure 118, as shown in FIGS. 2C-1 and 2C-2 in accordance with some embodiments. The conductive layer 128 may be made of metal materials such as Co, W, Ru, Al, Mo, Ti, Cu, metal alloys, other applicable conductive materials, or a combination thereof. The conductive layer 128 may be formed by a chemical vapor deposition process (CVD), a physical vapor deposition process (PVD), (e.g., evaporation or sputter), an atomic layer deposition process (ALD), an electroplating process, other suitable processes, or a combination thereof.

As shown in FIGS. 2C-1 and 2C-2, since the width of the opening 122 in the region 100 is greater than the width of the opening 122 in the region 200, the conductive layer 128 fills up the opening 122 in the second region 200 while the opening 122 remains between the conductive layer 128 in the first region 100. The opening 122 in the region 100 may be shrunk after depositing the conductive layer 128.

In some embodiments, the conductive layer 128 has a thickness in a range of about 1 nm to about 100 nm. If the conductive layer 128 is too thin, the dimension of the subsequently formed contact structure may not be well controlled and the resistance may be increased. If the conductive layer 128 is too thick, the following planarization process may not be well-controlled.

Figures 1, 2D:
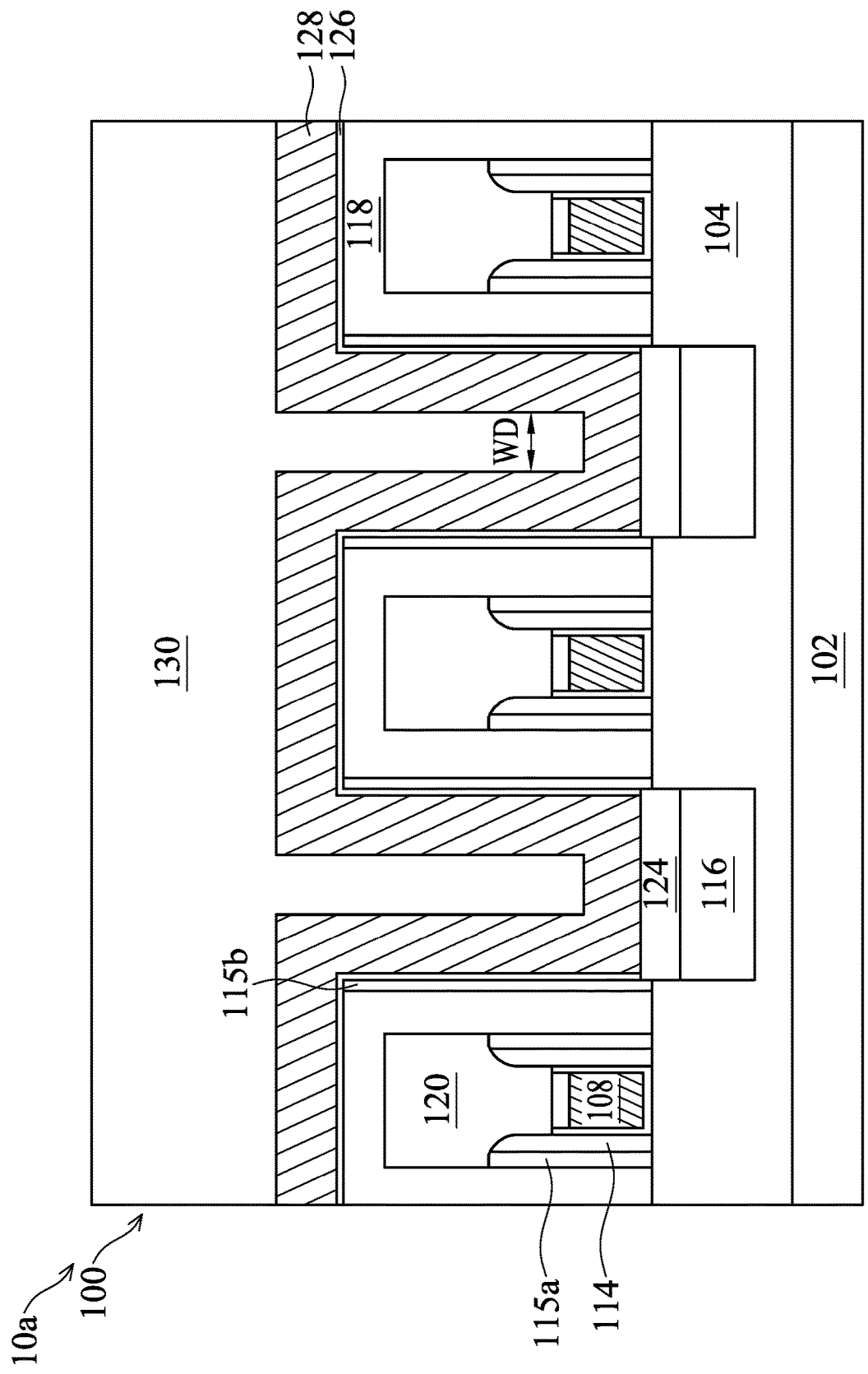
Figures 2, 2D:
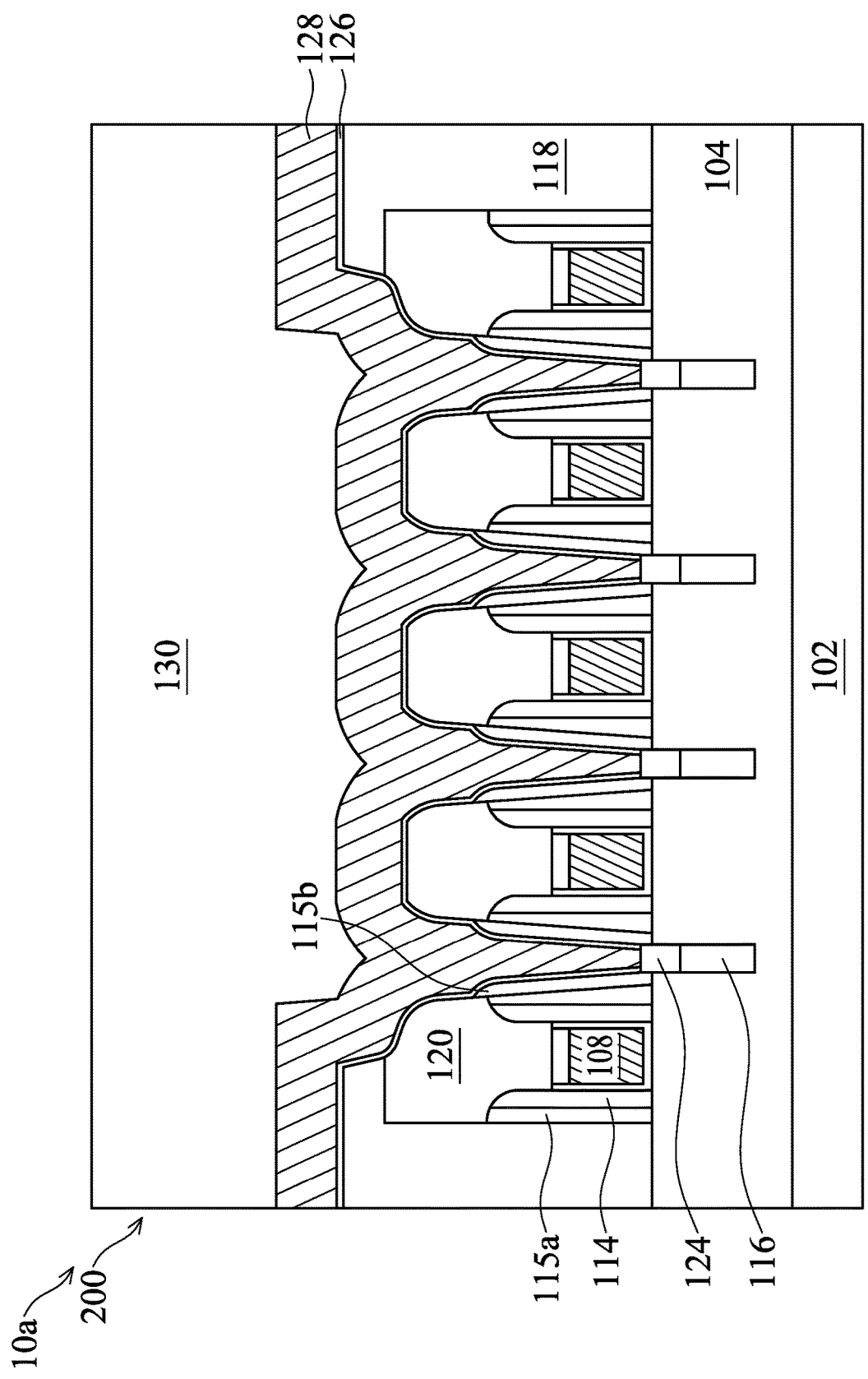

Next, as shown in FIGS. 2D-1 and 2D-2 in accordance with some embodiments, a dielectric material 130 is deposited over the conductive layer 128. The dielectric material 130 may be made of SiC, LaO, AlO, AlON, ZrO, HfO, SiN, ZnO, ZrN, ZrAlO, TiO, TaO, YO, TaCN, ZrSi, SiOCN, SiOC, SiCN, LaO, SiO, or a combination thereof. The dielectric material 130 may be formed by a chemical vapor deposition process (CVD), a physical vapor deposition process (PVD), (e.g., evaporation or sputter), an atomic layer deposition process (ALD), an electroplating process, other suitable processes, or a combination thereof.

As shown in FIGS. 2D-1 and 2D-2, since the width of the opening 122 in the first region 100 is greater than the width of the opening 122 in the second region 200 and the conductive layer 128 fills up the opening 122 in the second region 200, the dielectric material 130 only fills in the opening 122 in the first region 100. In some embodiments, since the conductive layer 128 is merged in the opening 122 in the second region 200, the dielectric material 130 is formed over the gate structure 108 in the second region 200. The bottom surface of the dielectric material 130 is higher than the top surface of the gate structure 108 in the second region 200.

As shown in FIG. 2D-1, the dielectric material 130 has a width WD in a range of about 1 nm to about 100 nm. If the dielectric material 130 is too narrow, the following planarization process may not be well-controlled. If the dielectric material 130 is too wide, the resistance may be increased.

Figures 1, 2E:
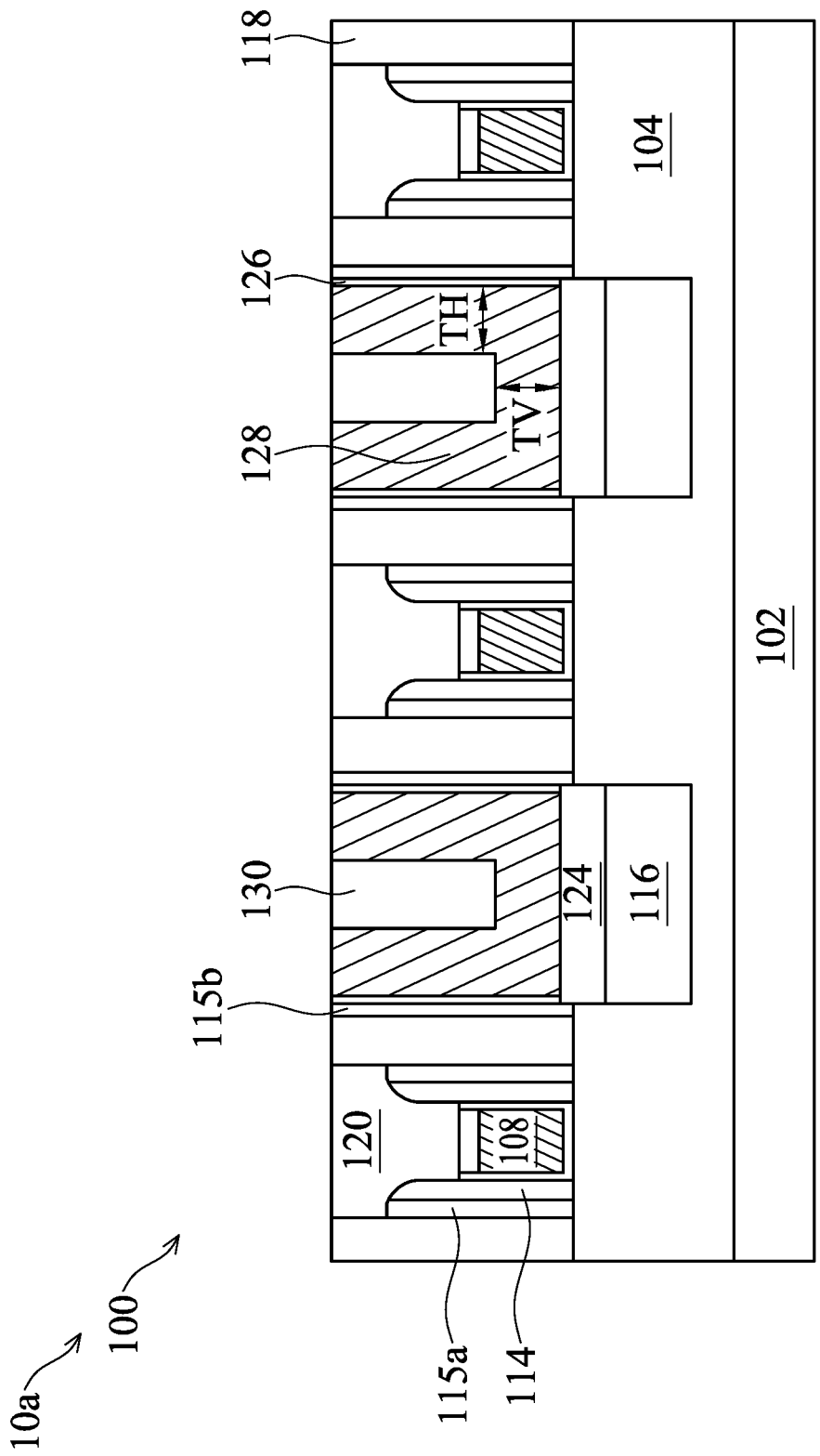
Figures 2, 2E:
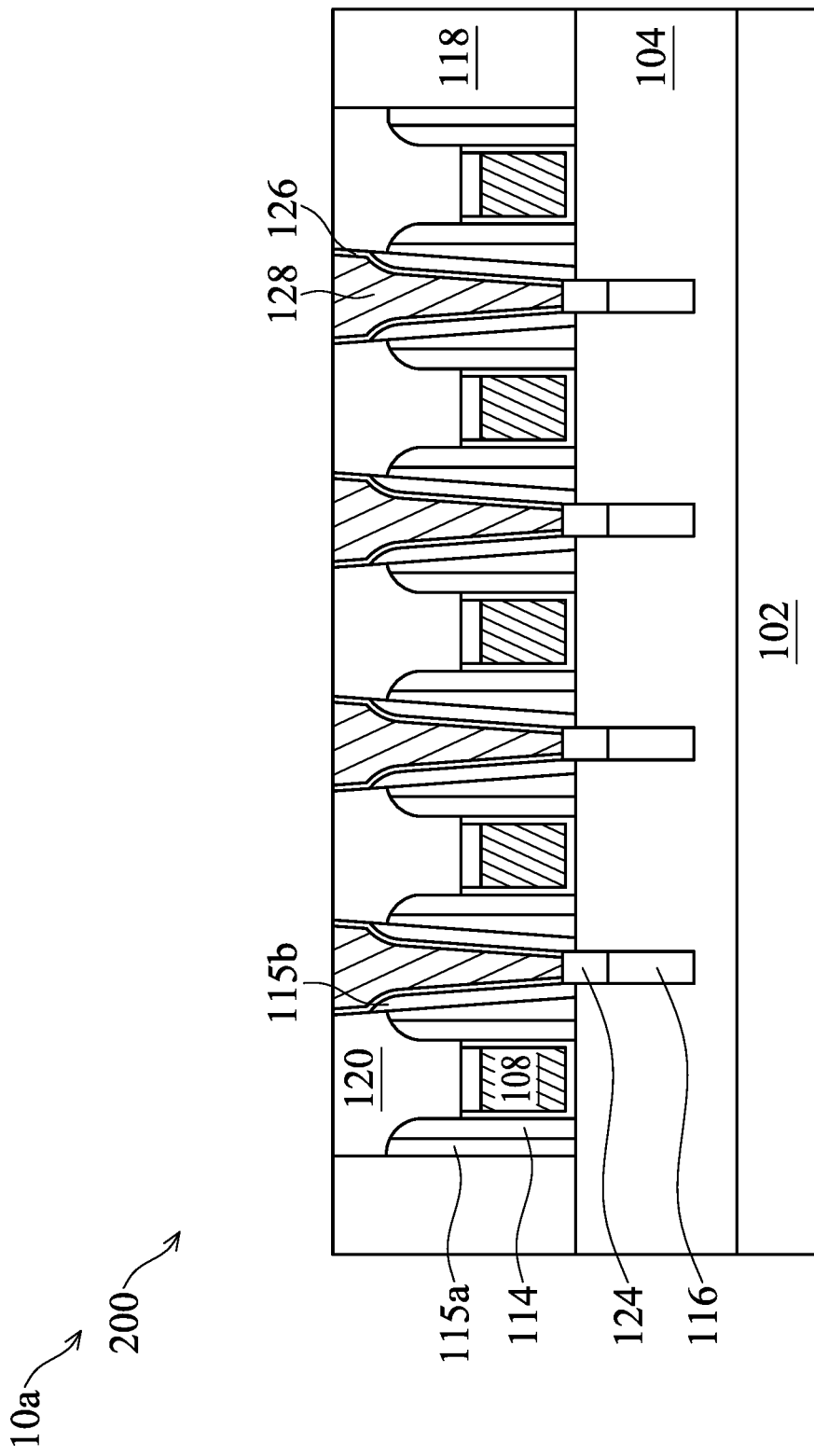

Next, as shown in FIGS. 2E-1 and 2E-2 in accordance with some embodiments, a planarization process such as a chemical mechanical polishing (CMP) process or an etch back process is performed to remove excess conductive layer 128 and dielectric material 130. After the planarization process, the top surfaces of the conductive layer 128 and the dielectric material 130 in the first region 100 are exposed. After the planarization process, the top surfaces of conductive layer 128 and dielectric material 130 may be level with the top surface of the first cap layer 120 and the top surface of the ILD structure 118. After the planarization process, a contact structure 128 is formed in the opening 122 between the gate structures 108, and a dielectric structure 130 is surrounded by the contact structure 128 in the first region 100, as shown in FIG. 2E-1 in accordance with some embodiments. After the planarization process, the dielectric material 130 in the second region 200 is completely removed, and the conductive layer 128 in the opening 122 is exposed, as shown in FIG. 2E-2 in accordance with some embodiments.

Since the conductive layer 128 is conformally formed, the horizontal thickness TH of the side portion of the contact structure 128 is substantially the same as the vertical thickness TV of the middle portion of the contact structure 128, as shown in FIG. 2E-1 in accordance with some embodiments.

Figures 1, 2F:
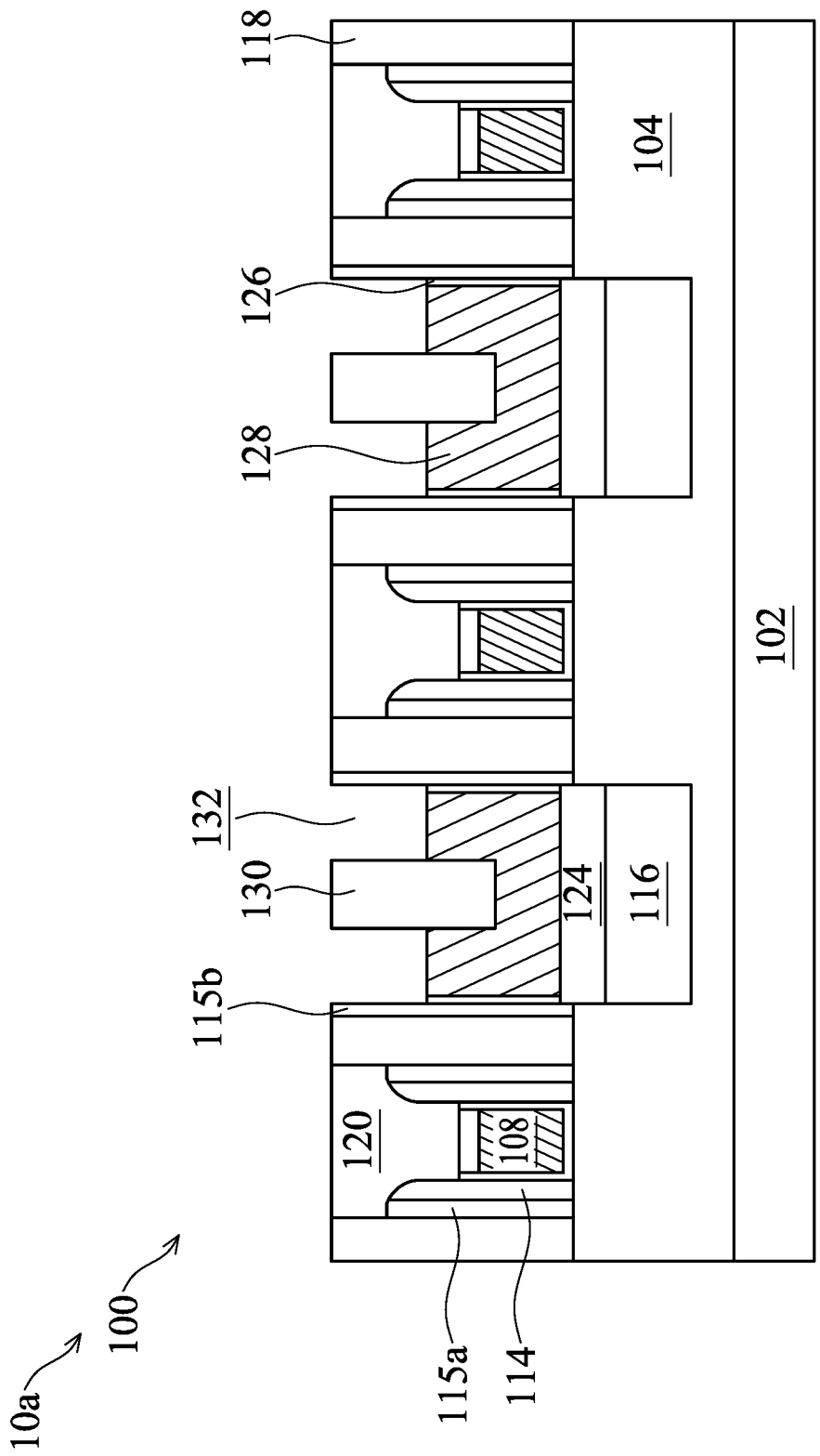
Figures 2, 2F:
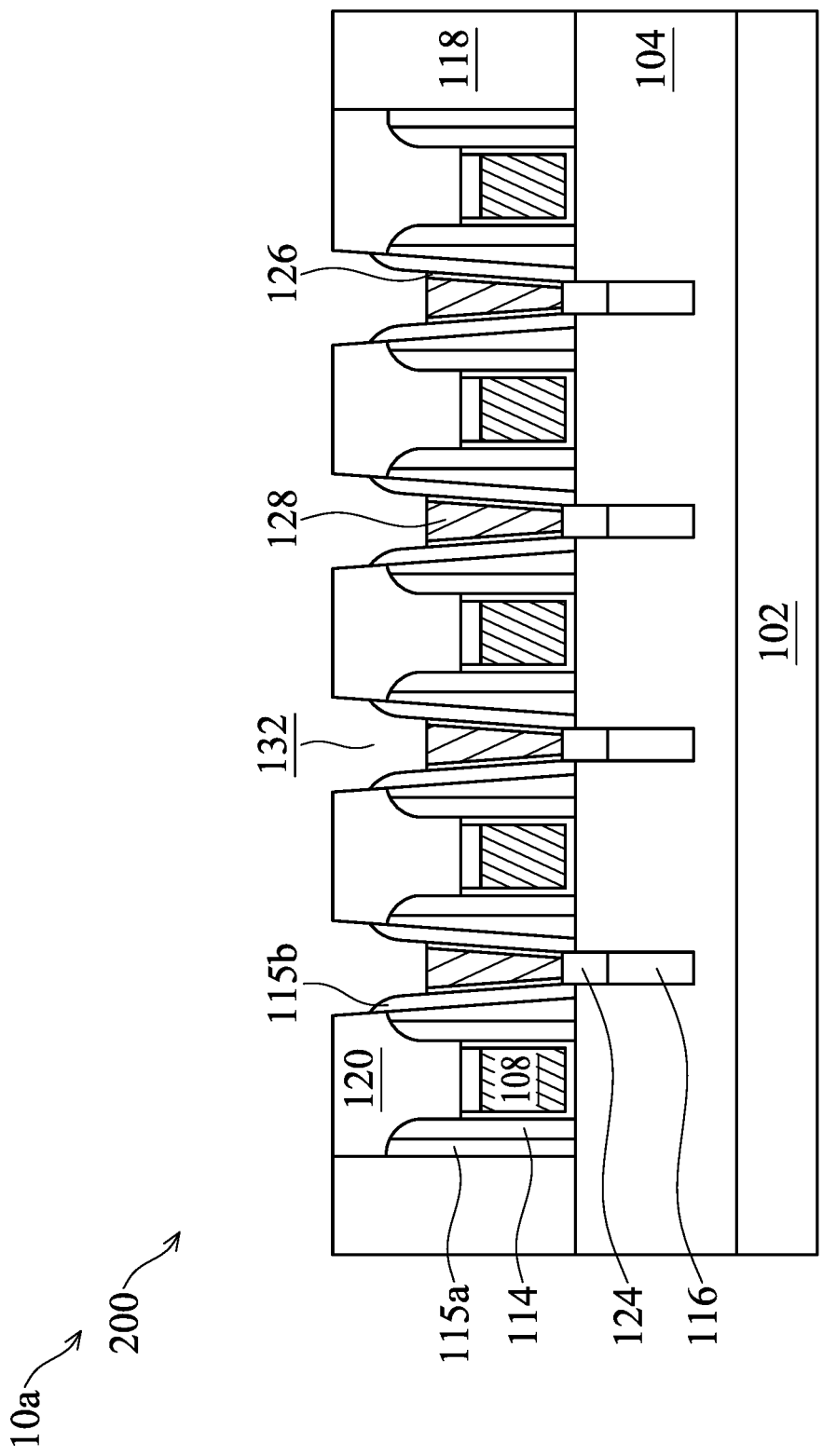

Next, the top portion of the contact structure 128 and the glue layer 126 are etched back to form a recess 132 over the contact structure 128 between the gate structures 108, as shown in FIGS. 2F-1 and 2F-2 in accordance with some embodiments. The etching back process may include one or more etching processes, such as dry etching and/or wet etching. In some embodiments as shown in FIGS. 2F-1, since there is etching selectivity between the dielectric layer 130 and the contact structure 128, the dielectric structure 130 protrudes from the contact structure 128 after the removing process. The recess 132 may surround the top portion of the dielectric structure 130. In some embodiments, the top surface of the dielectric structure 130 is substantially level with the top surfaces of the ILD structure 118 and the first cap layer 120. As shown in FIG. 2F-1, after the etching back process, the top surfaces of the glue layer 126 and the contact structure 128 is lower than the top surface of the dielectric structure 130. The top surface of the glue layer 126 may be exposed from the recess 132.

Figures 1, 2G:
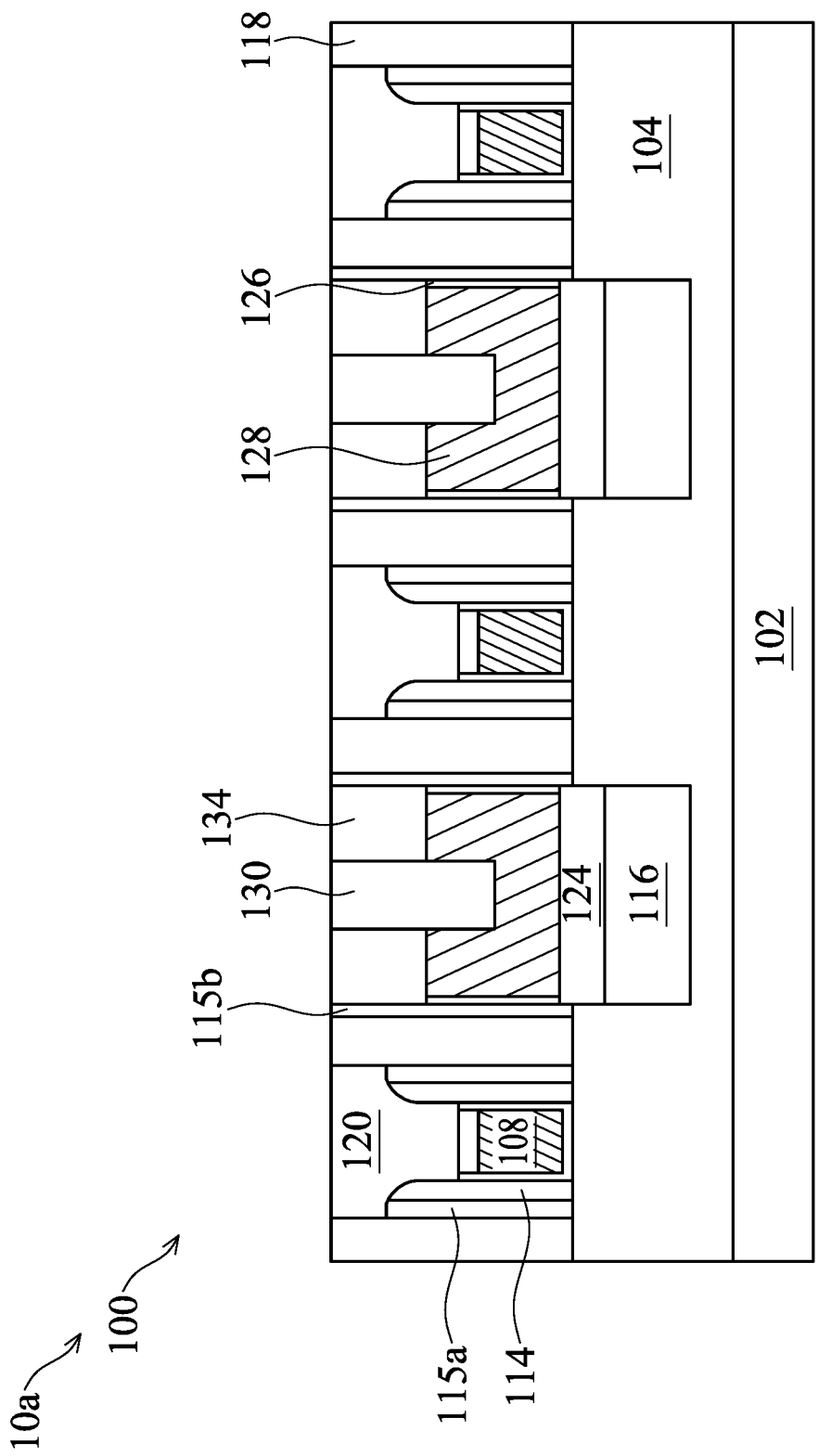
Figures 2, 2G:
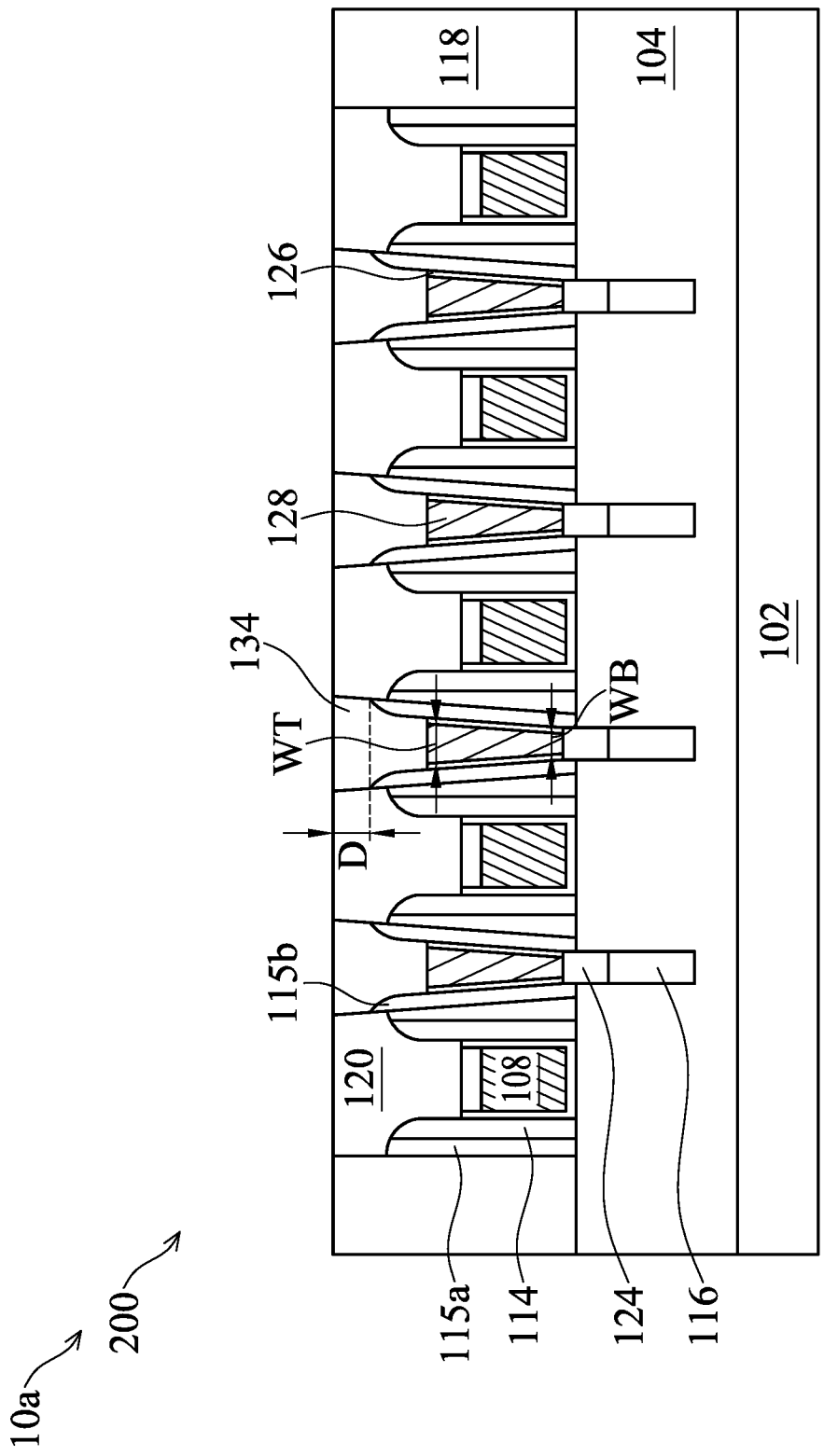

Afterwards, a second cap layer 134 is optionally formed in the recess 132 over the contact structure 128, as shown in FIGS. 2G-1 and 2G-2 in accordance with some embodiments. The second cap layer 134 may include dielectric materials such as SiC, LaO, AlO, AlON, ZrO, HfO, SiN, ZnO, ZrN, ZrAlO, TiO, TaO, YO, TaCN, ZrSi, SiOCN, SiOC, SiCN, LaO, SiO, or a combination thereof. In some embodiments, the second cap layer 134 and the first cap layer 120 are made of different materials, providing different etching selectivity in the subsequent process. The second cap layer 134, the second liner layer 115b, and the dielectric structure 130 may be made of the same material, therefore they may be removed simultaneously in the subsequent etching process. The second cap layer 134, the second liner layer 115b, and the dielectric structure 130 may be made of different materials. Applying different materials for those layers could diverse surface material. Therefore, there may be advantage of the selectivity among diverse materials and differentiate patterning purposes in the following processes.

The second cap layer 134 may be formed over the contact structure 128 by low-pressure chemical vapor deposition (LPCVD) or plasma enhanced chemical vapor deposition (PECVD), other suitable deposition processes, or a combination thereof. After the second cap layer 134 is deposited, a planarization process (e.g., a chemical mechanical polishing process or an etching back process) may optionally be performed to remove excess dielectric materials.

The second cap layer 134 may provide better isolation between the gate structure 108 and the contact structure 128. In some embodiments, the thickness of the second cap layer 134 is in a range from about 0.5 nm to about 30 nm. If the second cap layer 134 is too thick, the resistance may be increased. If the second cap layer 134 is too thin, the isolation between the gate structure 108 and the contact structure 128 may not be enough.

In some embodiments as shown in FIG. 2G-1, the contact structure 128 has a U-shape in a cross-sectional view in the region 100. Therefore, the height of the middle portion of the contact structure 128 is less than the height of the side portions of the contact structure 128. As shown in FIG. 2G-1, the lower portion of the dielectric structure 130 is wrapped by the contact structure 128. In some embodiments, the dielectric structure 130 is embedded in the second cap layer 134 and the contact structure 128.

As shown in FIG. 2G-1, in region 100, the dielectric structure 130 extends into the contact structure 128 under the top surface of the contact structure 128. Moreover, the dielectric structure 130 and the source/drain structure 116 are separated by the contact structure 128.

As shown in FIGS. 2G-1 and 2G-2, since the width W1 of the opening 122 in the region 100 is greater than the width W2 of the opening 122 in the region 200, the contact structure 128 in the first region 100 is wider than the contact structure 128 in the second region 200.

In addition, as shown in FIG. 2G-1, the second liner layer 115b is formed over the sidewalls of the contact structure 128 and the second cap layer 134. In some embodiments, the top surface of the second liner layer 115b is level with the top surface of the dielectric structure 130.

As shown in FIG. 2G-2 in accordance with some embodiments, since the dielectric structure 130 is removed and not embedded in the contact structure 128, the bottom surface area of the second cap layer 134 is substantially equal to the top surface area of the contact structure 128. In addition, as shown in FIG. 2G-2, the height of the middle portion of the second contact structure 128 is substantially the same as the height of the side portion of second contact structure 128.

As shown in FIG. 2G-2, a distance D between the top surface of the second liner layer 115b and the top surface of the second cap layer 134 is in a range from about 1 nm to about 20 nm. The top surface of the second liner layer 115b may also level with the top surface of the second cap layer 134.

As shown in FIG. 2G-2, a width WT of the top portion of the contact structure 128 is in a range from about 6 nm to about 30 nm, while a width WB of the bottom portion of the contact structure 128 is in a range from about 4 nm to about 28 nm. In some embodiments, the top portion of the contact structure 128 is wider than the bottom portion of the contact structure 128. If the width WT and WB of the contact structure 128 is too great, the area of the semiconductor device 10a may be too large. If the width WT and WB of the contact structure 128 is too less, it may be difficult to form the contact structure 128 in the opening 122.

It should be noted that, the structure of the semiconductor device 10a as shown in FIGS. 2G-1 and 2G-2 is merely an example, and the present disclosure is not limited thereto. In some embodiments, the contact structure 128 surrounding the dielectric structure 130 is formed on the backside of the wafer without the gate structure 108 formed next to it.

Forming a dielectric structure 130 embedded in the contact structure 128 may reduce the amount of conductive material removed during the planarization process. This may cut down the processing time, save money, and reduce process fluctuation. The chemical used in the planarization process is more flexible. In addition, since the contact structure 128 is thinner, the cohesion force of the contact structure 128 may be lowered, and the peeling issue may be prevented. The material selection of the contact structure 128 may have more choices.

As described previously, the dielectric structure 130 extending into the contact structure 128 in a wide spacing region 100 may provide a thinner contact structure 128 during the following planarization process. The selection of slurry chemical used in the planarization process may be more flexible. In addition, the peeling issue may also be avoided with thinner contact structure 128. Therefore, the selection of metal of the contact structure 128 may be also more flexible. This can reduce the required production time and cost. Since the contact structure 128 may be merged in the dense region 200, the dielectric structure 130 may only be formed in the region 100 with a wider contact structure 128.

Embodiments of a semiconductor device structure and a method for forming the same are provided. The method of forming the semiconductor device structure may include forming a dielectric structure embedded in the wide contact structure. Therefore, the metal of the contact structure and the chemical used in the planarization may be not limited. With thinner contact structure, the peeling issue may be prevented and the production time may be reduced and money may be saved.

In some embodiments, a semiconductor device structure is provided. The semiconductor device structure includes a fin structure formed over a substrate. The semiconductor device structure also includes a gate structure formed across the fin structure. The semiconductor device structure also includes a source/drain structure formed beside the gate structure. The semiconductor device structure also includes a contact structure formed over the source/drain structure. The semiconductor device structure also includes a dielectric structure extending into the contact structure. The dielectric structure and the source/drain structure are separated by the contact structure.

In some embodiments, a semiconductor device structure is provided. The semiconductor device structure includes a fin structure formed over a substrate. The semiconductor device structure also includes a source/drain structure formed over the fin structure. The semiconductor device structure also includes a first contact structure formed over the source/drain structure in a first region of the substrate. The semiconductor device structure also includes a first cap layer formed over the first contact structure. The semiconductor device structure also includes a dielectric structure embedded in the first cap layer and the first contact structure.

In some embodiments, a method for forming a semiconductor device structure is provided. The method for forming a semiconductor device structure includes forming a fin structure over a substrate. The method for forming a semiconductor device structure also includes forming a gate structure across the fin structure. The method for forming a semiconductor device structure also includes growing a source/drain structure next to the gate structure. The method for forming a semiconductor device structure also includes depositing an ILD structure over the fin structure. The method for forming a semiconductor device structure also includes forming a first opening in the ILD structure exposing the source/drain structure in a first region of the substrate. The method for forming a semiconductor device structure also includes conformally depositing a conductive layer over the sidewall and the bottom surface of the first opening. The method for forming a semiconductor device structure also includes filling a dielectric material in the first opening. The method for forming a semiconductor device structure also includes planarizing the dielectric material to expose top surfaces of the conductive layer and the dielectric material in the first region.

In some embodiments, a semiconductor device structure is provided. The semiconductor device structure includes a gate structure formed over a substrate. The semiconductor device structure also includes a source/drain structure formed beside the gate structure. The semiconductor device structure further includes a contact structure formed over the source/drain structure. The semiconductor device structure also includes a first cap layer formed over the contact structure. The semiconductor device structure further includes a dielectric structure extending from a top surface of the first cap layer into the contact structure. The dielectric structure and the source/drain structure are separated by the contact structure.

In some embodiments, a semiconductor device structure is provided. The semiconductor device structure includes a first source/drain structure formed over a first region of a substrate. The semiconductor device structure also includes a first contact structure electrically connected to the first source/drain structure. The semiconductor device structure further includes a first cap layer formed over the first contact structure. The semiconductor device structure also includes a dielectric structure having an upper portion embedded in the first cap layer and a lower portion embedded in the first contact structure.

In some embodiments, a semiconductor device structure is provided. The semiconductor device structure includes a source/drain structure formed over a fin structure. The semiconductor device structure also includes a metal semiconductor compound layer formed over the source/drain structure. The semiconductor device structure further includes a contact structure formed over the metal semiconductor compound layer and having a first top surface higher than a second top surface. The semiconductor device structure also includes a cap layer formed over the first top surface of the contact structure. The semiconductor device structure further includes a dielectric structure formed over the second top surface of the contact structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
  a gate structure formed over a substrate;
  a source/drain structure formed beside the gate structure;
  a contact structure formed over the source/drain structure;
  a first cap layer formed over the contact structure, wherein a first portion of the first cap layer is disposed on a first portion of a top surface of the contact structure, and a second portion of the first cap layer is disposed on a second portion of the top surface of the contact structure; and
  a dielectric structure over the contact structure, wherein an upper portion of the dielectric structure is between the first portion of the first cap layer and the second portion of the first cap layer,
  wherein the dielectric structure and the source/drain structure are separated by the contact structure.

2. The semiconductor device structure as claimed in claim 1, wherein the contact structure has a U-shape in a cross-sectional view.

3. The semiconductor device structure as claimed in claim 2, wherein a horizontal thickness of a side portion of the contact structure is substantially the same as a vertical thickness of a middle portion of the contact structure.

4. The semiconductor device structure as claimed in claim 1, further comprising:
  a glue layer formed over a sidewall of the contact structure and covered by the first cap layer.

5. The semiconductor device structure as claimed in claim 1, further comprising:
  a liner layer formed over a sidewall of the contact structure and a sidewall of the first cap layer,
  wherein a top surface of the liner layer is substantially level with the top surface of the first cap layer and a top surface of the dielectric structure.

6. The semiconductor device structure as claimed in claim 1, further comprising:
  a second cap layer formed over the gate structure,
  wherein the first cap layer and the second cap layer are made of different materials.

7. The semiconductor device structure as claimed in claim 6, further comprising:
  an ILD structure formed between the first cap layer and the second cap layer.

8. A semiconductor device structure, comprising:
  a first source/drain structure formed over a first region of a substrate;
  a first contact structure electrically connected to the first source/drain structure;
  a first cap layer formed over the first contact structure; and
  a dielectric structure having an upper portion embedded in the first cap layer and a lower portion embedded in the first contact structure, wherein the lower portion of the dielectric structure is between opposite sidewalls of the first contact structure in a plane parallel to a top surface of the substrate.

9. The semiconductor device structure as claimed in claim 8, further comprising:
  a second source/drain structure formed over a second region of the substrate;
  a second contact structure electrically connected to the second source/drain structure; and
  a second cap layer formed over the second contact structure,
  wherein the first contact structure is wider than the second contact structure.

10. The semiconductor device structure as claimed in claim 9, further comprising:
  a liner layer formed over a sidewall of the second contact structure and a sidewall of the second cap layer,
  wherein a top surface of the liner layer is covered by the second cap layer.

11. The semiconductor device structure as claimed in claim 10, wherein the top surface of the liner layer is curved.

12. The semiconductor device structure as claimed in claim 9, wherein a width of the second contact structure decreases toward the second source/drain structure.

13. The semiconductor device structure as claimed in claim 8, further comprising:
  a liner layer formed over a sidewall of the first contact structure,
  wherein a bottom surface of the liner layer is lower than a bottom surface of the first contact structure, and a top surface of the liner layer is higher than a top surface of the first contact structure.

14. A semiconductor device structure, comprising:
  a source/drain structure formed over a fin structure;
  a metal semiconductor compound layer formed over the source/drain structure;
  a contact structure formed over the metal semiconductor compound layer and having a first top surface higher than a second top surface, wherein the contact structure has a U-shape in a cross-sectional view;
  a cap layer formed over the first top surface of the contact structure; and
  a dielectric structure formed over the second top surface of the contact structure.

15. The semiconductor device structure as claimed in claim 14, wherein the dielectric structure protrudes above the first top surface of the contact structure.

16. The semiconductor device structure as claimed in claim 14, wherein the dielectric structure comprises SiC, LaO, AlO, AlON, ZrO, HfO, SiN, ZnO, ZrN, ZrAlO, TiO, TaO, YO, TaCN, ZrSi, SiOCN, SiOC, SiCN, LaO, SiO, or a combination thereof.

17. The semiconductor device structure as claimed in claim 14, further comprising a liner layer extending along a sidewall of the contact structure and a sidewall of the cap layer.

18. The semiconductor device structure as claimed in claim 1, wherein the first portion of the first cap layer and the second portion of the first cap layer are in contact with the top surface of the contact structure.

19. The semiconductor device structure as claimed in claim 1, wherein an interface between the dielectric structure and the contact structure has a U-shape in a cross-sectional view.

20. The semiconductor device structure as claimed in claim 1, wherein a first portion of the contact structure is on a left sidewall of the dielectric structure, and a second portion of the contact structure is on a right sidewall of the dielectric structure.

* * * * *